US006991958B2

(12) United States Patent
Salafsky

(10) Patent No.: US 6,991,958 B2
(45) Date of Patent: Jan. 31, 2006

(54) SOLID-STATE ELECTRIC DEVICE

(75) Inventor: Joshua Salafsky, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 10/258,868

(22) PCT Filed: Mar. 5, 2002

(86) PCT No.: PCT/US02/06752

§ 371 (c)(1),
(2), (4) Date: Mar. 19, 2003

(87) PCT Pub. No.: WO02/071496

PCT Pub. Date: Sep. 12, 2002

(65) Prior Publication Data

US 2003/0170959 A1 Sep. 11, 2003

Related U.S. Application Data

(60) Provisional application No. 60/273,366, filed on Mar. 5, 2001.

(51) Int. Cl.
*H01L 21/00* (2006.01)

(52) U.S. Cl. ............................ 438/63; 438/48; 438/57

(58) Field of Classification Search .................. 438/63, 438/57, 48, 73

See application file for complete search history.

(56) References Cited

U.S. PATENT DOCUMENTS

| | | | | |
|---|---|---|---|---|
| 3,522,339 A | | 7/1970 | Te Velde | 264/129 |
| 4,618,509 A | | 10/1986 | Bulkowski | 427/74 |
| 6,239,355 B1 | * | 5/2001 | Salafsky | 136/250 |
| 2002/0023894 A1 | * | 2/2002 | Rossi | 216/2 |
| 2003/0104316 A1 | * | 6/2003 | Wang et al. | 430/296 |

FOREIGN PATENT DOCUMENTS

| | | |
|---|---|---|
| EP | 1028475 | 8/2000 |

OTHER PUBLICATIONS

Frey et al. "Ultraflat Nanoshpere Lithography: A New Method to Fabricate Flat Nanostructures" Oct. 16, 2000, Adavanced Materials, vol. 20, No. 20, pp1515-9.*

* cited by examiner

*Primary Examiner*—Bradley K. Smith
(74) *Attorney, Agent, or Firm*—Baker Botts L.L.P.

(57) ABSTRACT

A solid state electric device includes templated charge-carrier-transporting channel layer interposed between a pair of conductive substrates. The templated charge-carrier-transporting channel layer includes a layer of a first charge-carrier-transporting material having one or more regions defined using templating techniques, in which a second charge-carrier-transporting material is deposited. The second charge-carrier-transporting material is distributed within the templated charge-carrier-transporting channel layer such that, predominantly, only a single contiguous part of the second charge-carrier-transporting material is interposed between the first conductive substrate and the second conductive substrate along any imaginary normal axis extending between the two conductive substrates.

12 Claims, 6 Drawing Sheets

(a)

(b)

SOLID-STATE ELECTRIC DEVICE

CROSS-REFERENCES TO RELATED APPLICATIONS

This application is based on Provisional Application Ser. No. 60/273,366, filed Mar. 5, 2001, which is incorporated herein by reference for all purposes and from which priority is claimed.

BACKGROUND OF THE INVENTION

1. Field of the Invention

The present invention relates generally to solid-state electric devices, and more particularly, it relates to solid state photoelectric devices that employ a templated channel architecture.

2. Description of Related Art

Photovoltaic cells were first developed in the 1950's as p-n junctions of inorganic materials. A wide variety of cells since then have been fabricated using homojunction, heterojunction and tandem architectures with inorganic materials, most commonly silicon. As solar cells, the devices convert solar radiation (sunlight) directly into direct-current electrical power. However, widespread terrestrial use of the cells has been impeded by the high peak-watt energy cost compared with that derived from fossil fuels.

Amorphous silicon has been contemplated as a highly promising alternative to the more expensive crystalline silicon and efforts have been undertaken at constructing cells from this material. However, at present the best silicon photovoltaic cells are much more expensive than conventional energy sources.

An alternative to silicon-based cells was introduced by U.S. Pat. No. 5,084,365 to Grätzel et al. The cell introduced by Grätzel et al. is an example of a relatively efficient photovoltaic device which is fairly simple to fabricate using low-cost materials. The operating principle is based on the dye-sensitization of a wide-band gap metal oxide, nanoporous semiconductor layer. In particular, the layer is formed with an interconnected network of nanocrystals of titanium dioxide coated with a single molecular layer of a light absorbing ruthenium-based dye. When the dye layer absorbs light, electrons are transferred to the nanocrystal conduction band. The charge is transported through a number of nanocrystals in the nanocrystal layer (on the order of microns thick) to a transparent, conducting oxide electrode. The circuit is completed with an electrolyte with a redox couple and a counter electrode impregnated with a platinum catalyst.

The dye-sensitized photoelectrochemical cell developed by Grätzel et al. is about as efficient as the best amorphous silicon devices; however, these cells employ a liquid electrolyte which requires that the cells be hermetically sealed. In practice, such sealing can be difficult to achieve. If the cells are not properly sealed, the electrolyte can evaporate with a concomitant decrease in efficiency.

Other efficient and low-cost alternatives to silicon-based devices have also been introduced. For example, conjugated polymers have been developed for a variety of electronic device applications, such as FETs, photovoltaic cells, LEDs and lasers. Photovoltaic devices using conjugated polymers blended with $C_{60}$ have been formed in both a pn-type junction architecture, as well as in an interpenetrating network architecture of semiconductor nanocrystals. However, the efficiencies of these devices tend to be much lower than those of the Grätzel et al. device or silicon devices. For that reason, such devices are not currently viable candidates for widespread commercialization.

The photovoltaic devices in the prior art can be grouped into two basic architectures. One group embodies planar junction devices, which include the conventional photovoltaic devices (inorganic materials such as silicon) and several of the conjugated polymer devices. In these devices, the free charge carriers, or excitons, created by light absorption diffuse to the junction interface where they are spatially separated, leading to the photovoltaic effect.

The other group embodies an interpenetrating network architecture and includes the Grätzel et al. cell and the conjugated polymer devices blended with $C_{60}$ and semiconductor nanocrystals. In this type of architecture, elements of one type of material, for example semiconductor nanocrystals or $C_{60}$ molecules, interpenetrate another material where they are physically and electrically coupled to form a charge-transporting network. The network is necessary in the case of the dye-sensitized nanocrystal device to produce sufficient surface area, and thus dye area, to effect adequate light absorption. In devices formed from conjugated polymers blended with other polymers, nanocrystals or $C_{60}$ molecules, the structure and operation of the devices is based on an interpenetrating network wherein elements of the latter materials are electrically interconnected and embedded within the polymer material.

As the above examples indicate, those involved with solid-state electric devices, and more particularly, solid-state photo-electric devices, have recognized the need for a low cost device formed in a fully solid-state embodiment that exhibits high efficiency, and ease of fabrication.

Indeed, some in the field have proposed solid-state photoelectric devices that include a channel architecture. Thus, in U.S. Pat. No. 6,239,355, issued May 29, 2001 to Salafsky, there is disclosed a photovoltaic device having a channel architecture produced using pre-formed nanoparticles and a conjugated polymer material. The nanoparticles are prepared as a dispersion in methanol or water, and mixed with a soluble pre-cursor form of poly (p-phenylene vinylene) (PPV) to form a nanocrystal-polymer mixture. The nanocrystal-polymer mixture is then spin-coated on a transparent conducting oxide (TCO) layer to establish a desired distribution of nanoparticles.

Despite the extensive work previously conducted in the field of solid-state electric devices, there remains a need for techniques that allow for inexpensive production of highly efficient solid-state electric devices.

SUMMARY OF THE INVENTION

An object of the present invention is to provide an inexpensive solid-state electric device that is simple to fabricate and exhibits a high efficiency.

In order to meet this and other objects which will become apparent with reference to further disclosure set forth below, the present invention provides a solid-state electric device with a templated charge-carrier-transporting channel layer, and a methodology for creating such a solid-state electric device. The solid state electric device includes a first conductive substrate, a second conductive substrate, and a templated charge-carrier-transporting channel layer. The templated charge-carrier-transporting channel layer is interposed between the first and second conductive substrates. The templated charge-carrier-transporting channel layer is defined as a layer formed by depositing a removable template on the first conductive substrate, depositing a layer of a first charge-carrier-transporting material on the removable template, removing the template to define one or more regions in the first charge-carrier-transporting material and depositing a second charge-carrier-transporting material in at least one of the one or more defined regions. An average distribution of the second charge-carrier-transporting material within the layer of the first charge-carrier-transporting material is such that, predominantly, only a single contiguous part of the second charge-carrier-transporting material is interposed between the first conductive substrate and the second conductive substrate along any imaginary normal axis extending between the two conductive substrates.

The templated charge-carrier-transporting channel layer can include, e.g., a conjugated polymer material and a semiconductor particulate material. The semiconductor particulate material can include, e.g., semiconductor crystals, such as titanium dioxide.

In an alternative embodiment, multiple solid-state electric devices can be formed in a stacked configuration. In either the single or stacked configuration, the device can be formed such that it is mechanically flexible.

The accompanying drawings, which are incorporated and constitute part of this disclosure, illustrate preferred embodiments of the invention and serve to explain the principles of the invention.

Figure 1:
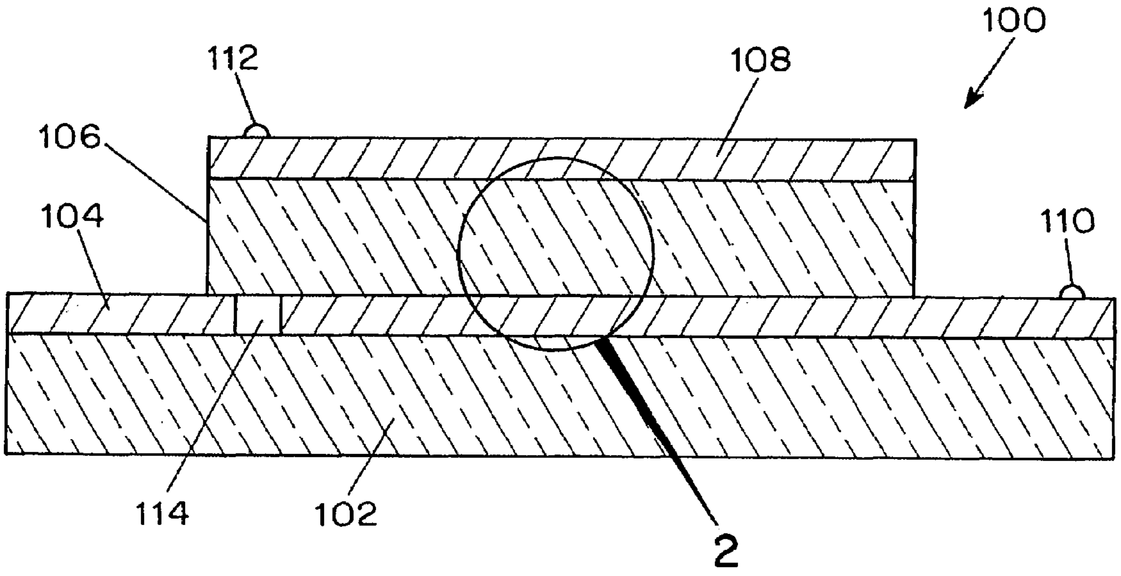
FIG. 1 is a schematic diagram of a solid-state electric device in accordance with the present invention, illustrating the channel architecture having a templated charge-carrier-transporting channel layer separating a pair of conductive substrates.

Throughout the figures, the same reference numerals and characters, unless otherwise stated, are used to denote like features, elements, components or portions of the illustrated embodiments. Moreover, while the present invention will now be described in detail with reference to the figures, it is done so in connection with the illustrative embodiments. It is intended that changes and modifications can be made to the described embodiments without departing from the true scope and spirit of the subject invention as defined by the appended claims.

DETAILED DESCRIPTION OF THE PREFERRED EMBODIMENTS

FIG. 1 is a schematic diagram of a solid-state electric device formed in accordance with the present invention which is based on a novel templated channel architecture. As used herein, the term solid-state electric device includes both semiconductor devices and photoelectric devices. Photoelectric devices include photovoltaic devices, which produce electrical energy or signals when exposed to light, as well as photoemissive devices, which generate light in the presence of applied electrical energy. The solid-state electric device 100 includes a first conductive substrate 104, a second conductive substrate 108 and a templated charge-carrier-transporting channel layer 106.

In one embodiment of the present invention, the solid-state electric device 100 is a photoelectric device formed on a substrate 102, such as glass. The first conductive substrate 104 is a transparent conducting oxide (TCO) layer which is formed on the substrate 102. The substrate 102 can, alternatively, itself be conductive, thus removing the need for a TCO layer 104. The substrate 102 may be mechanically rigid or flexible and may be, e.g., a thin foil or a conductive plastic. At least a portion of the TCO layer 104 is covered with the templated charge-carrier-transporting channel layer 106.

The second conductive substrate 108 is formed over at least a portion of the templated charge-carrier-transporting channel layer 106. The second conductive substrate 108 may be formed over the templated charge-carrier-transporting channel layer 106 by using, e.g., vapor deposition of aluminum or other suitable conductive material. Alternatively, the second conductive substrate 108 may be formed by using gas or solution phase deposition of a conductive material, or simply by sandwiching the second conductive substrate 108 on top of the templated charge-carrier-transporting channel layer 106. A first electrical contact 110 is formed on the TCO layer 104, and a second electrical contact 112 is formed on the second conductive substrate 108 to facilitate connection of the photoelectric device 100 to external circuitry.

A portion 114 of the TCO layer 104 located in a region under contact 112 can be removed, such as by chemical etching using HCl and Zn as a catalyst. This can reduce the likelihood of a short circuit between the first conductive substrate 104 and the second conductive substrate 108 which can result from pressure exerted by contact 112 through the mechanically soft templated channel layer 106 when making contact to the device.

In such an exemplary configuration of FIG. 1, at least a portion of light which is incident on the surface of the substrate 102 passes through the substrate 102 and TCO layer 104 where photons are absorbed by the templated charge-carrier-transporting channel layer 106. If the second conductive substrate 108 does not permit non-absorbed light to pass therethrough, such non-absorbed light is reflected back into the templated charge-carrier-transporting channel layer 106 where the photons can be absorbed. Alternatively, the second conductive substrate 108 can be formed from a TCO and light, which is incident upon the surface of the second conductive substrate 108, can be transmitted to the templated charge-carrier-transporting channel layer 106 for absorption. In this case, the substrate 102 and layer 104 may be, but need not be, transparent, translucent or opaque.

Figure 2:
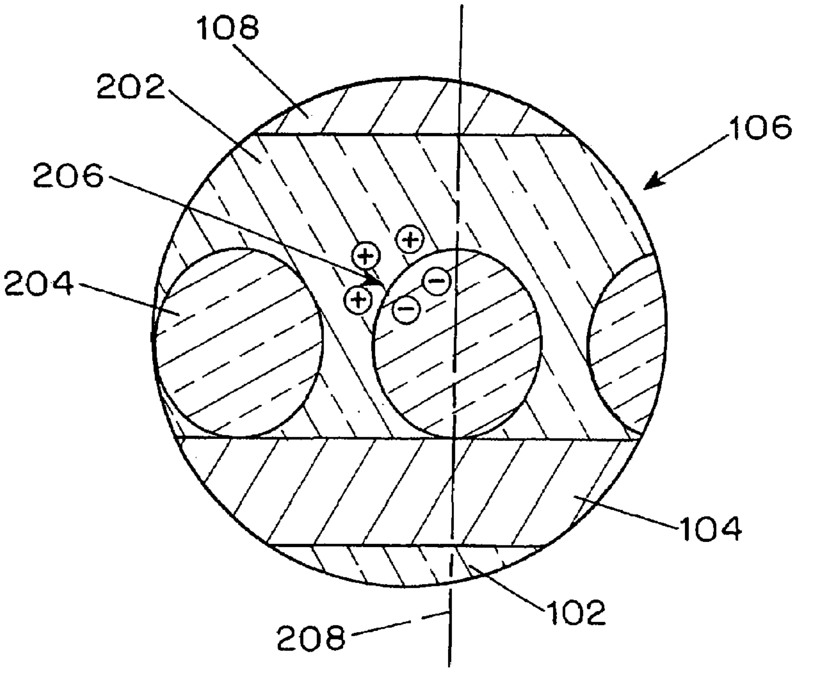
FIG. 2 is a schematic diagram showing an enlarged portion of the device illustrated in FIG. 1 and further illustrating the templated charge-carrier transporting channel layer.

FIG. 2 is a schematic diagram further illustrating the templated channel architecture of the layer 106. The templated charge-carrier-transporting channel layer 106 is generally formed by depositing a layer of a first charge-carriertransporting material 202 over a removable template and depositing a second charge-carrier-transporting material 204 in the regions defined in the first charge-carrier-transporting material 202 by removing the template. The first charge-carrier-transporting material 202 can be a conjugated polymer (such as PPV), a semiconductor, an oligomer, or a conducting polymer. The second charge-carrier-transporting material 204 can also take various forms, e.g., those of semiconductor, conjugated polymer, oligomer, or conducting polymer.

The second charge-carrier-transporting material 204, such as a nanostructure material, thus resides within the layer of the first charge-carrier-transporting material 202. The term nanostructures, as used herein, refers to particles, generally of crystalline structure, typically on the order of one to hundreds of nanometers in diameter. As used herein, the term templated channel architecture refers to a templated architecture of the charge-carrier-transporting channel layer 106 wherein the average distribution of the second charge-carrier-transporting material 204 (e.g., nanostructures) within the layer of the first charge-carrier-transporting material 202 (e.g., a conjugated polymer) is such that, predominantly, only a single contiguous part of the second charge-carrier-transporting material 204 is interposed between the first conductive substrate 104 and the second conductive substrate 108 along any imaginary normal axis 208 extending between the two conductive substrates. The templated architecture is obtained using a templating methodology described in detail further below with reference to FIG. 3.

Various templating methodologies are known in the art, and have been referred to as "nanotemplating," "nanosphere lithography," or "natural lithography." An exemplary templating methodology is disclosed in J. C. Hulteen et al., *Nanosphere Lithography: Size-Tunable Silver Nanoparticle and Surface Cluster Arrays*, J. Phys. Chem. 103, 3854–3863 (1999), the contents of which are incorporated by reference herein. Other exemplary templating techniques are disclosed in Winzer et al. *Fabrication of Nano-dot- and Nano-ring-arrays by Nanosphere Lithography*, Appl. Phys. A63, 617–19 (1996), Jiang et al., *Single-Crystal Colloidal Multilayers of Controlled Thickness*, Chem. Mater. 11, 2132–2140 (1999), Jiang et al., *Template-Directed Preparation of Macroporous Polymers with Oriented and Crystalline Arrays of Voids*, J. Am. Chem. Soc. 121, 11630–637 (1999) and Deckman et al., *Natural Lithography*, Appl. Phys. Lett. 41, 377 (1982), the contents of which are incorporated by reference herein.

Figure 3:
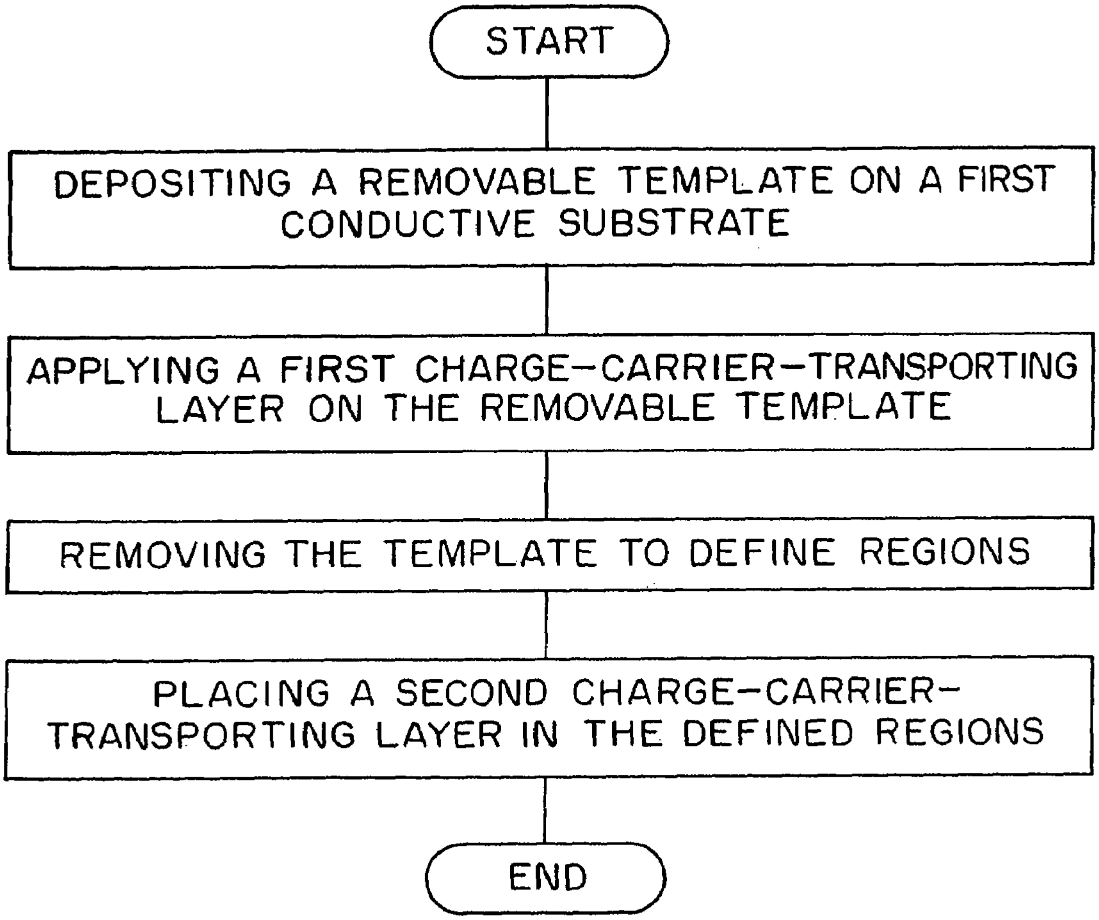
FIG. 3 is a flow diagram illustrating an exemplary embodiment of a method for creating a solid-state electric device having a templated charge-carrier-transporting channel layer according to the present invention.

In accordance with the present invention, such variant templating methodologies are used to create solid-state electric devices having one or more templated charge-carrier-transporting channel layers. FIG. 3 is a flow diagram illustrating an exemplary embodiment of a method for creating a solid-state electric device having a templated charge-carrier-transporting channel layer according to the present invention. The templated charge-carrier-transporting channel layers are formed by initially depositing a removable template on the first conductive substrate 104 in step 310. The removable template may include, e.g., single- or multi-layer arrays of nanoparticles. The nanoparticles may be, for example, polystyrene nanospheres. The nanospheres are preferably monodisperse or nearly so, and with a preferred diameter of between 10 and 300 nm. For example, the polystyrene nanospheres of 80 nm diameter may be deposited on the first conductive substrate 104 by spin-coating a solution of the spheres.

The layer of the first charge-carrier-transporting material 202 is then deposited over the template, and more particularly, in the interstitial places of the array particle template in step 320. The deposition techniques include, for example, spin coating, casting, evaporation, thermal spraying, solution phase deposition, liquid phase deposition, gas phase deposition, or any other technique known in the art for depositing a material on a substrate. The first charge-carrier-transporting material 202 may be, for example, a conjugated polymer, but it may also be Titanium Dioxide ($TiO_2$). The total thickness of the templated charge-carrier-transporting channel layer 106 is preferably between 1 and 2 times the diameter of the polystyrene nanospheres.

The size and shape of the structures formed in the interstitial spaces of the array particle template are determined by the size, geometry, packing and physico-chemical properties of the array particles (P) and the first charge-carrier-transporting material 202. Referring to FIGS. 4A–4J, a set of diagrams showing an exemplary monolayer and bilayer nanoparticle arrays used as templates, and the layer of first charge-carrier-transporting material deposited in interstitial places is illustrated.

Figure 4A:
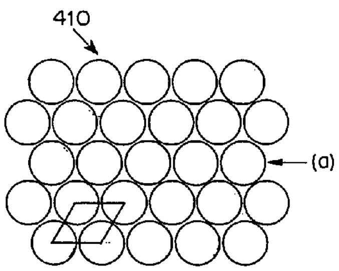
FIGS. 4A–4J are illustrative diagrams showing an exemplary monolayer and bilayer nanoparticle arrays used as templates, and charge-carrier-transporting material placed in interstitial places.
Figure 4C:
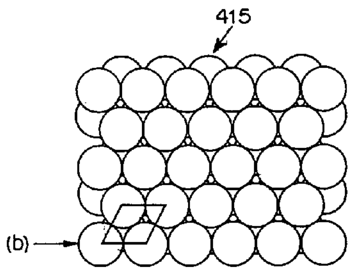

In FIGS. 4A and 4C, a monolayer array 410 and bilayer array 415 of polystyrene nanospheres are illustrated, respectively. Other template shapes may be used without departing from the spirit and scope of the invention, e.g., cylindrical shapes (see FIGS. 5A and 5B). These arrays 410 and 415 of polystyrene nanospheres represent a removable template, which is deposited on the first conductive substrate 104. Once the monolayer array 410 (or bilayer array 415) is deposited on the first conductive substrate 104, the layer of the first charge-carrier-transporting material 202 is deposited to fill the interstitial spaces of the monolayer array 410 (or bilayer array 415) deposited on the first conductive substrate 104. The corresponding patterns of the first charge-carrier-transporting material 202 occupying the interstitial spaces between the monolayer array 410 (or the bilayer array 415) are illustrated in FIGS. 4B and 4D, respectively.

Figure 4B:
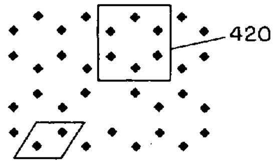
Figure 4D:
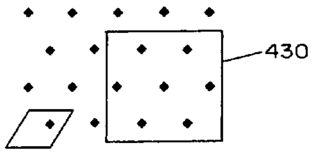
Figure 4E:
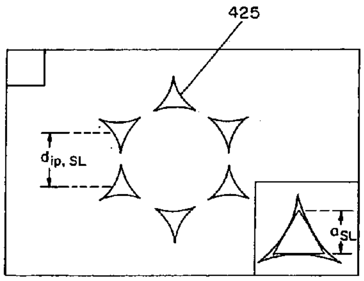

Referring to FIG. 4B, the interstitial spaces of the monolayer array 410 filled with the first charge-carrier-transporting material 202 form a set of patterns 420, which is further illustrated in FIG. 4E. Each part 425 of the pattern 420 formed with the first charge-carrier-transporting material 202 filling the interstitial spaces of the monolayer array 410 has a substantially triangular form. In case of the bilayer array 415 of polystyrene nanospheres, each part 435 of a pattern 430 has a substantially hexagonal form, as illustrated in FIGS. 4D and 4F.

Figure 4G:
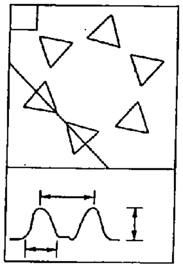
Figure 4H:
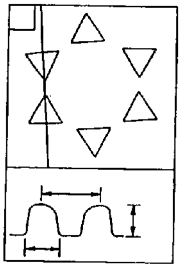
Figure 4F:
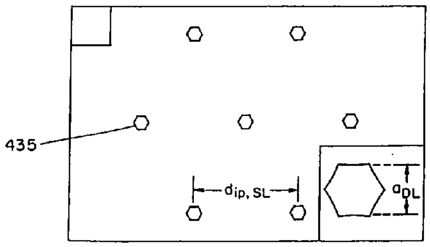
Figure 4I:
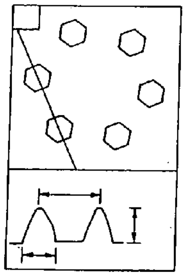
Figure 4J:
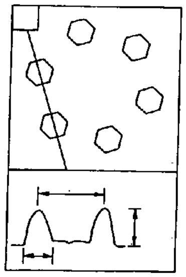

FIGS. 4G–4J illustrate atomic force microscope images or the patterns formed by the templating process for both the monolayer and bilayer arrays. FIGS. 4G and 4H refer to the triangular shapes of the interstitial spaces of the monolayer array 410, whereas FIGS. 4I and 4J refer to the hexagonal shapes of the interstitial spaces of the bilayer array 415.

Referring back to FIG. 3, once the layer of the first charge-carrier-transporting material 202 is deposited, the template is removed to define one or more regions in step 330. The second charge-carrier-transporting material 204 is finally deposited in the defined regions within the layer of the first charge-carrier-transporting material 202 in step 340.

The exemplary photoelectric device illustrated in FIGS. 1 and 2 operates in the following manner. Light incident on the device passes through the transparent or semi-transparent substrate 102 and TCO layer 104 to the templated charge-carrier-transporting channel layer 106. Light in the visible and near-UV region of the spectrum can be absorbed by the first charge-carrier-transporting material 202 and converted to single excitons or free charge carriers, which diffuse to a nanostructure interface 206. At the interface 206, the excitons become dissociated; thus, electrons are transferred to one charge-carrier-transporting material, e.g., the second charge-carrier-transporting material 204, leaving holes behind in the other charge-carrier-transporting material, e.g., the layer of first charge-carrier-transporting material 202. Radiation with photon energies above the bandgap of the nanostructured material can be absorbed to give free charge carriers followed by a hole transfer process.

For example, the first charge-carrier-transporting material 202 may be a hole-transporting material such as a conjugated polymer, and the second charge-carrier-transporting material 204 may be an electron-transporting semiconductor nanostructure material such as Titanium dioxide. Since the templated charge-carrier-transporting channel layer 106 is formed such that on average, the predominant charge path is defined by only a single nanostructure 204 interposed between the first conductive substrate 104 and the second conductive substrate 108 at any given location, a majority of electrons transferred at the interface 206 are channeled by a single nanostructure 204 directly to the first conductive substrate 104 (i.e., without requiring a passage to other nanostructures as in a network architecture). In a similar fashion, holes are transported through the polymer 202 to the second conductive substrate 108. This results in an electrical current in an external circuit connected across electrical contacts 110 and 112.

Figure 5A:
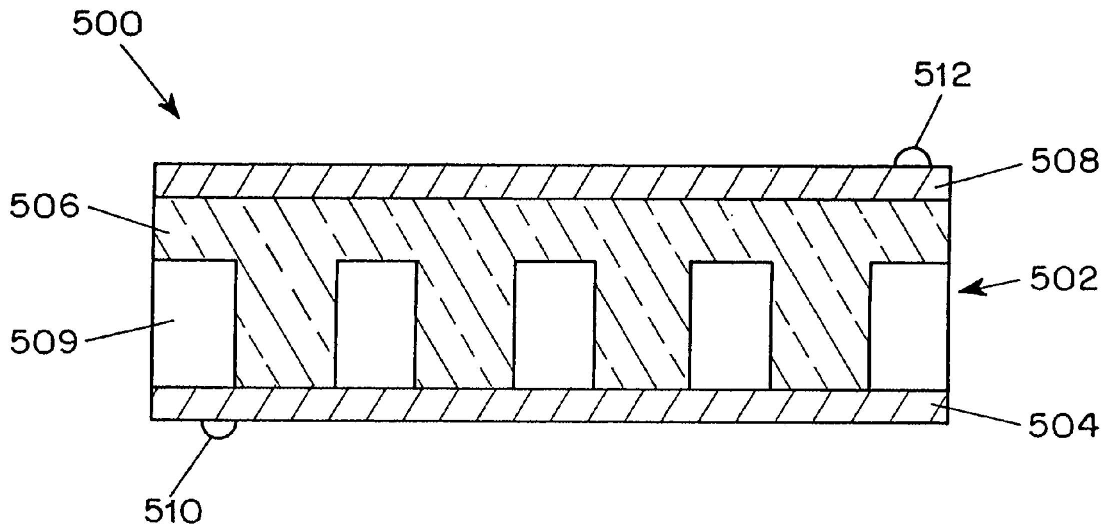
FIGS. 5A and 5B are schematic diagrams illustrating two different exemplary templated charge-carrier-transporting channel layers.

The layer of the first charge-carrier-transporting material 202 can be formed with sufficient thickness such that a region of the polymer material exists between the edge of the nanostructures 204 and the second conductive substrate 108, as illustrated in FIG. 5A. Referring to FIG. 5A, a schematic diagram illustrating an exemplary templated charge-carrier-transporting channel layer 502 is illustrated. A solid-state electric device 500 includes the templated channel layer 502, which further includes a material A 509 forming "tunnels" or "cylindrical channels" embedded in a layer of material B 506. The templated channel layer 502 is interposed between two conductive substrates 504 and 508 to which contacts 510 and 512 are connected. The material B 506 has such a thickness so as to form a region between the material A 509 and the second conductive substrate 508. This region acts as a blocking layer which inhibits bidirectional charge carrier flow, thereby reducing electron-hole recombination at the second conductive substrate 508.

Figure 5B:
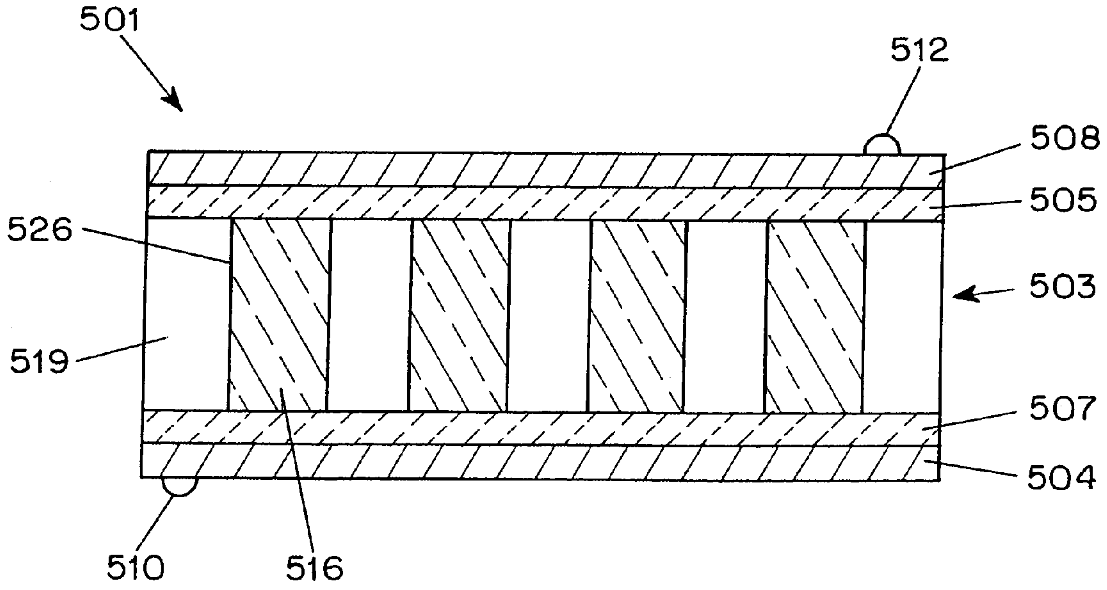

Alternatively, the thickness of the polymer can be reduced and an additional blocking layer can be formed between the second charge-carrier-transporting material and the second conductive substrate 508, as illustrated in FIG. 5B. Referring to FIG. 5B, a schematic diagram illustrating another exemplary templated charge-carrier-transporting channel layer 503 is illustrated. A solid-state electric device 501 includes the templated channel layer 503, which further includes a material A 519 forming "tunnels" or "cylindrical channels" embedded in a layer of material B 516. The templated channel layer 503 is interposed between two blocking layers 505 and 507, on which a first and second conductive substrates 504 and 508 are disposed, respectively. The use of a separate blocking layer, in combination with a thinner polymer layer, may improve device efficiency as more excitons which form within the first charge-carrier-transporting material 516 will be within one diffusion length of a nanostructure interface 526. However, the addition of a separate blocking layer adds an additional processing step, which will generally increase the device cost.

Referring back to FIG. 2, the individual chains of the polymer forming the first charge-carrier-transporting material 202 can have a variety of size distributions. The nanostructures 204 may be somewhat monodisperse, of roughly spherical morphology and exhibit an average diameter from typically on the order of a few nanometers to microns. When distributed in the polymer layer 202, the spacing between nanostructures 204 is preferably on the order of the diffusion length of an exciton in the particular polymer. This is generally in the range of about 10–30 nm, but can vary outside of this range.

As previously indicated, the first charge-carrier-transporting material 202 may be a polymer and the second charge-carrier-transporting material may be Titanium dioxide. Alternatively, the first charge-carrier-transporting material may be Titanium dioxide, and the second charge-carrier-transporting material 204 may be a polymer, e.g., regioregular 3-hexylthiophene. In such a case, Titanium dioxide is deposited in the interstitial spaces between the arrayed nanoparticles, representing the removable template, using e.g., spin coating, casting, evaporation, thermal spraying, solution phase deposition, liquid phase deposition, gas phase deposition, or any other technique known in the prior art for depositing a material on a substrate. Some exemplary techniques for depositing $TiO_2$ are disclosed in, e.g., Kishimoto et al., *Photocatalytic Activity of Titanium Oxide Prepared by Liquid Phase Deposition* (*LPD*), J. Mater. Chem., 8(9), 2019–2024 (1998), and B. A. Gregg, *Bilayer Molecular Solar Cells on Spin-coated $TiO_2$ Structures*, Chem. Phys. Lett. 258, 376 (1999), the contents of which are incorporated by reference herein.

In this exemplary embodiment, the $TiO_2$ layer may be formed by spin-coating a solution of $TiCl_4$ and 2-propanol (producing titanium isopropoxide and HCl), which is then diluted with 50 ml toluene. The polystyrene nanoparticles are then removed by dissolution in $CH_2Cl_2$ aided by sonication. This leaves the $TiO_2$ structures patterned on the substrate 104. The patterned array (A) can be heat annealed at a temperature of 450° C. Subsequently, regioregular 3-hexylthiophene is spin-coated on the substrate 104 to create the templated charge-carrier-transporting channel layer 106. In this embodiment, the $TiO_2$ structures absorb light above the bandgap of semiconductor and transport electrons in the conduction band, whereas the 3-hexylthiophene absorbs light and transports holes. Light absorbed by the 3-hexylthiophene is converted to excitons which diffuse to a $TiO_2$ interface 206.

At the interface 206, the excitons become dissociated, namely, electrons are transferred to the $TiO_2$ structures leaving holes behind in the 3-hexylthiophene. Radiation with photon energies above the bandgap of the $TiO_2$ can be absorbed to give free charge carriers followed by a hole transfer process to 3-hexylthiophene. Since the templated charge-carrier-transporting channel layer 106 is formed such that, on average, the predominant charge path is defined by only a single particle or structure of $TiO_2$ interposed between the first conductive substrate 104 and the second conductive substrate 108 at any given location, a majority of electrons are channeled by a single structure of $TiO_2$ directly to the second conductive substrate 108. In a similar fashion, holes are transported through the 3-hexylthiophene material to the first conductive substrate 104. This results in an electrical current in an external circuit connected across the electrical contacts 110 and 112.

Figure 6:
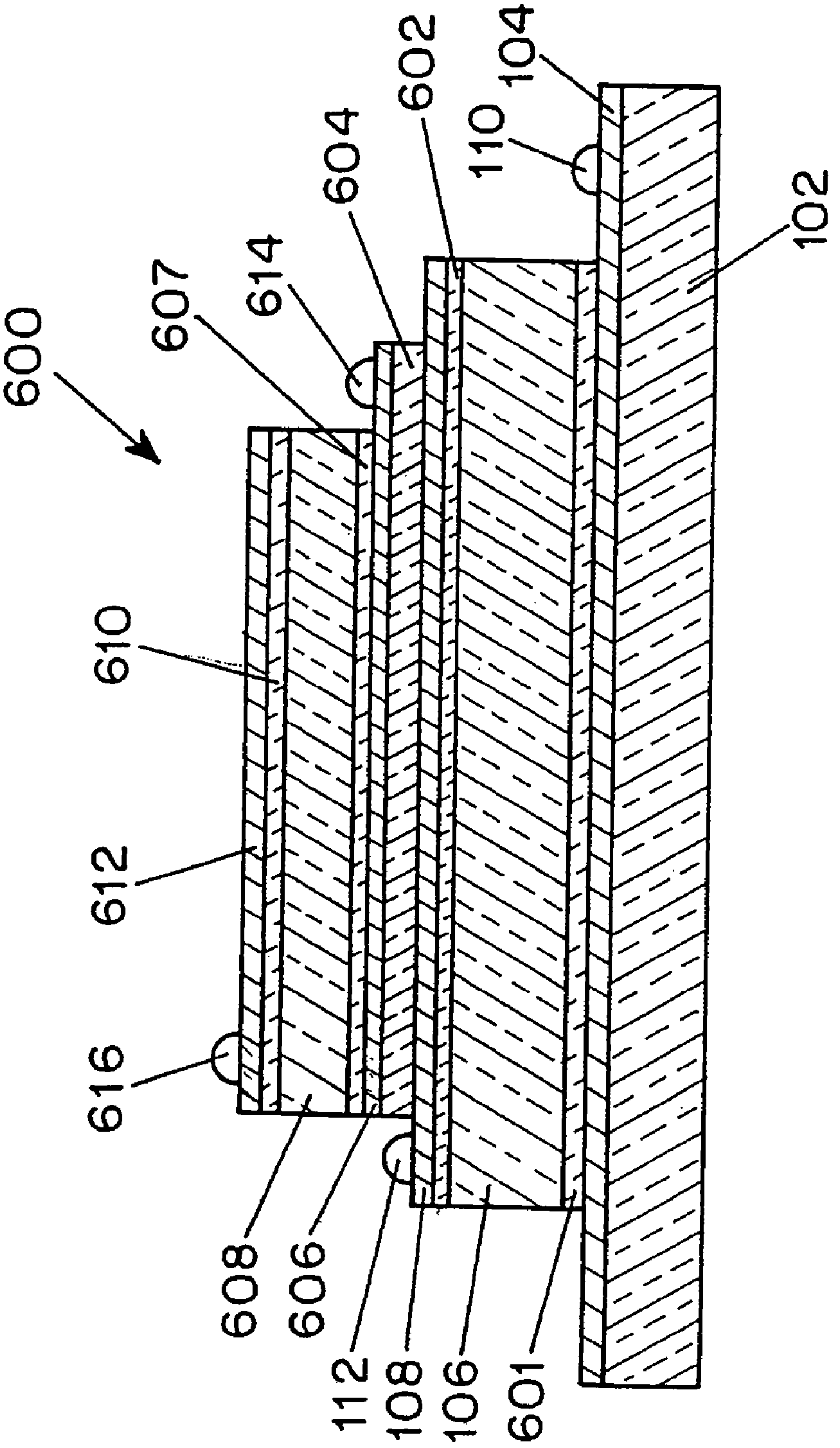
FIG. 6 is a schematic diagram of an alternative embodiment of a solid-state electric device in a stacked configuration, in accordance with the present invention.

FIG. 6 illustrates another embodiment of the present invention wherein two photoelectric devices, substantially as described in connection with FIGS. 1 and 2, are cooperatively formed on a common substrate 102 in a stacked configuration. Such an embodiment is particularly useful in detecting multiple wavelengths of incident light. As with the embodiment of FIG. 1, a solid-state electric device 600 includes a substrate 102, a first conductive substrate 104, a first templated charge-carrier-transporting channel layer 106, a second conductive substrate 108 and contacts 110 and 112. In addition, the device 600 includes a blocking layer 602 interposed between the templated channel layer 106 and the second conductive substrate 108. The device 600 also includes an electrical isolating layer 604 disposed on the second conductive substrate 108. A second solid-state electric device is formed over the isolating layer 604, the device including a third conductive substrate 606, a second templated charge-carrier channel layer 608, a second blocking layer 610, a fourth conductive substrate 612 and electrical contacts 614 and 616.

As illustrated in FIG. 6, one or more blocking layers 601, 602, 607 and 610 can be interposed between the conductive substrates and the templated channel layers. The blocking layers are selected to allow only one charge carrier type to pass to the underlying contact and thereby reduce charge recombination at the conductive substrate-templated channel layer interface. For example, with metal oxide semiconductor nanoparticles and a conjugated polymer layer, a thin layer of metal oxide can be applied to the electrodes to operate as a blocking layer. This can be accomplished by a number of known techniques, such as spin-coating followed by thermal firing, chemical vapor deposition, physical vapor deposition, etc. Blocking layers may also be composed of polymer materials which pass one charge carrier type while blocking the others.

In this embodiment, the blocking layer 602, second conductive substrate 108, isolating layer 604 and third conductive substrate 606 may be substantially transparent to allow transmission of incident light to the second templated charge-carrier-transporting channel layer 608. Preferably, the first templated channel layer 106 is selected to be responsive to a first wavelength of incident light whereas the second templated channel layer 608 is selected to be responsive to a second wavelength of incident light. For example, a PPV-$TiO_2$ combination, which is responsive to light of about 350–500 nm, can be used for the first templated channel layer 106 and a MEH-PPV-$TiO_2$ combination, which is responsive to light in the region of about 500–600 nm, can be used to form the second templated channel layer 608, where MEH-PPV is poly(2-methoxy-5-(2'-ethyl-hexyloxy)-1,4-phenylene vinylene).

In a further embodiment of the present invention, the patterned or templated first charge-carrier-transporting material A can be used as a pattern for its further growth (at a given site, for example in a catalysis reaction) in a separate processing step.

In another embodiment, multiple layers of masks can be created by varying the mask preparation conditions (e.g., the concentration of nanospheres or spin-coating parameters). Moreover, various Titanium oxide structures may be created by using a liquid phase deposition of a solution of ammonium hexafluorotitanate [$(NH_4)_2TiF_6$] and boric acid [$HBO_3$], which may involve spin-casting, dip-coating, evaporation, spin-coating, etc. The templates may be formed from particles that vary in shape and composition, and can range in size from nanometers to microns. The templates may be formed using photolithography, self-assembly, microcontact printing or other techniques known in the art for creating ordered, patterned structures useful as templates.

While the techniques according to the present invention have been described with reference to photoelectric devices, it must be noted that other solid-state electric devices also stand to benefit from these techniques. For example, they may be used with respect to bipolar junction transistors, as illustrated in FIG. 7.

Figure 7:
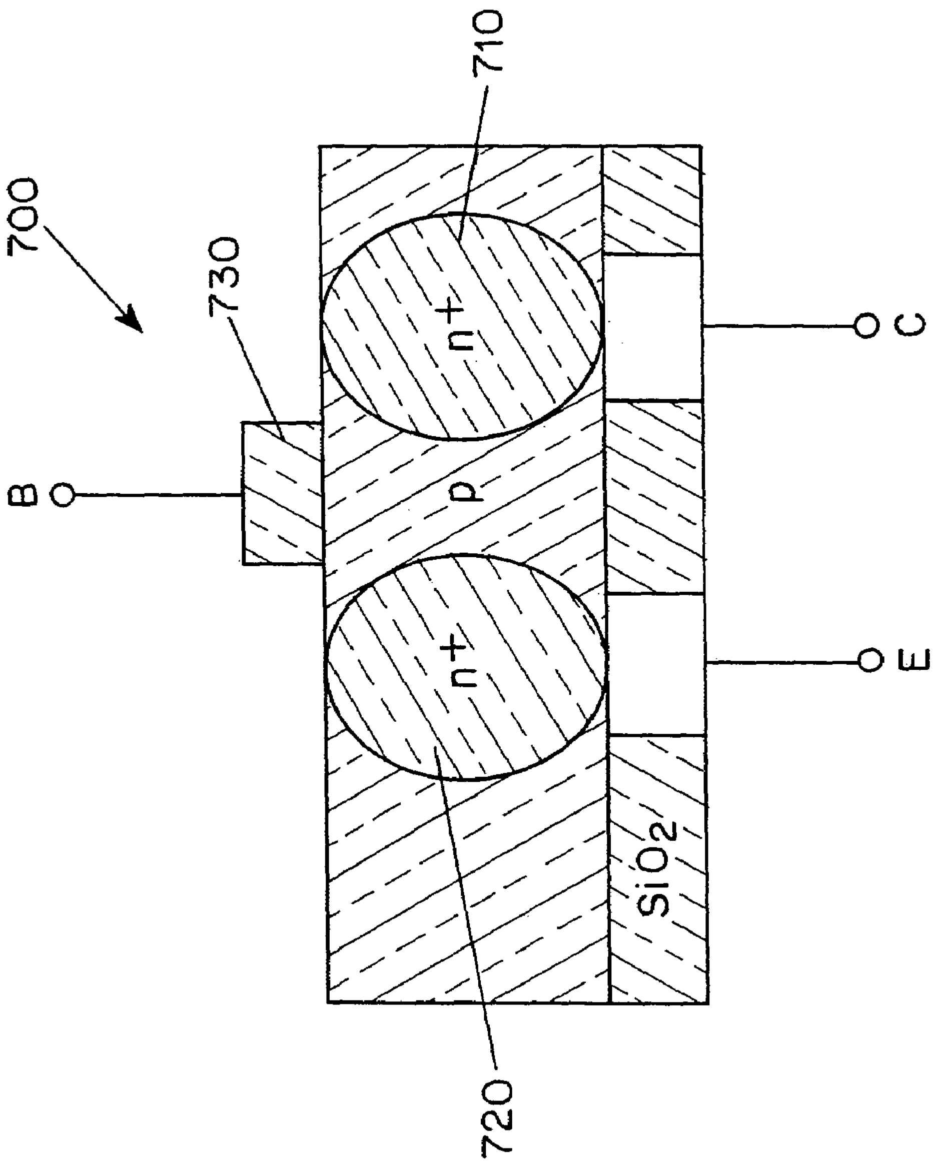
FIG. 7 is a schematic diagram of an n-p-n bipolar junction transistor using single n-type nanocrystals embedded in a p-type polymer film.

FIG. 7 is a schematic diagram of an n-p-n bipolar junction transistor 700 designed using single n-type nanocrystals embedded in a p-type polymer film. The transistor 700 includes a collector 710, an emitter 720 and a base 730. The collector 710 and emitter 720 of the n-p-n type bipolar junction transistor are single semiconductor n+-type nanocrystals. They are embedded in a p-type material, representing the base 730, such as a conjugated, conducting polymer. Each semiconductor nanocrystal-polymer interface is an electronic junction.

In a conventional transistor, the junction areas are of order $10^{-5}$ $cm^2$ ($10^9$ $nm^2$) and the stored charge density at the junctions is of order 10 $nC/cm^2$. Switching the base voltage by ±3–5 V thus requires a charge density of order 1 pC. If the source switching the base voltage supplies a maximum of 1 mA of current, it takes about 1 ns to switch voltages.

If semiconductor nanocrystals act as the emitter and collector electrodes, however, the junction area would be from 10–1000 $nm^2$ on up. Above a nanocrystal size of 10 nm, quantum charging effects of the nanocrystals merge into a bulk type behavior so that single-electron charging effects, such as those found in devices using smaller particles, are avoided. For a 100 $nm^2$ area junction, for instance, a sub-picosecond switching time is easily achieved using these device parameters.

The device materials and preparation conditions described herein may be widely varied while still achieving a solid-state electric device with the desired templated channel architecture. The material composition, size and shape of the channels, as well as the types of charge-carrier-transport materials and removable templates can also be varied. For example, thiophene derivatives, phenylene-vinylene derivatives, regioregular poly(3-hexylthiophene), TCNQ (tetracyano-quinodimethane) and derivatives, MEH-PPV, MEH-CN-PPV, POPT—poly(octylthiophene) or other such conjugated, semiconducting or conducting polymers may be used. Dyes, small molecules or oligomers such as pentacene, hexylthiophene, semiconducting, conducting molecules or materials and pthalocynines may also be used. Both charge-carrier-transporting materials can be doped to improve the charge transport or other properties. In general, many combinations of material components can be used as long as at least two of the components exhibit a mutual, charge-carrier transfer process (or charge-rectifying process) and the materials are arranged in the templated channel architecture, i.e., a predominance of single nanocrystal charge paths between a first and second conductive substrates at any given point.

The size, shape and composition of conductive substrates 104 and 108 can be varied. For example, a wide range of metals including Cu, Al, Ag, Au and others may be used in addition to various TCOs. The conductive substrates can also be composed of polymeric electrodes such as PEDOT (a highly conductive p-doped polythiophene polymer). Furthermore, the composition of the supporting substrate 102 and conductive substrates 104 and 108 may be varied. For instance, they may be polymers or polymer foils, such as polyethylene terephthalate, polyvinyl chloride, aramid or polyamide, and also metal foils provided with an insulating top layer, glass or other layer. The substrate 102 is generally transparent or translucent, however, the substrate can be formed from an opaque material if the materials on the opposing side of the photoactive channel layer(s) are formed from a transparent or translucent material.

The substrates of the device can be curvilinear or mechanically flexible resulting in a light-weight device suitable for building applications among others. The device can be made integrally or separately (modular or in sections) according to the advantages of each mode of fabrication. The conductive substrate etching can be done in a variety of methods available to a person skilled in the art. The templated charge-carrier-transporting channel layer 106 can be applied via means other than spin-coating, such as by spin-casting, spraying, chemical vapor deposition, physical vapor deposition, dip-coating, printing, painting, etc. The TCO layer 104 can be formed in a known manner, such as by Metal Organic Chemical Vapor Deposition (MOCVD), sputtering, Atmospheric Pressure Chemical Vapor Deposition (APCVD), PECVD, evaporation, screen printing, sol-gel processing, etc. Examples of materials suitable for use as the TCO layer 104 are indium tin oxide, tin oxide, $SnO_2$:F, etc. For each of the processing steps described herein, a range of processing temperatures, pressures, and other process parameters can be used to achieve the desired channel architecture.

The present invention employs a novel templated channel architecture to achieve a highly efficient, solid state electric device. The templated channel architecture lends itself to the use of low cost materials and low cost manufacturing steps, which result in a cost-effective end product.

Although the present invention has been described in connection with specific exemplary embodiments, it should be understood that various changes, substitutions and alterations can be made to the disclosed embodiments without departing from the spirit and scope of the invention as set forth in the appended claims.

What is claimed is:

1. A method for creating a solid-state electric device having a templated charge-carrier-transporting channel layer, comprising the steps of:

(a) depositing a removable template on at least a portion of a first conductive substrate;

(b) depositing a layer of a first charge-carrier-transporting material on said removable template;

(c) removing said template to thereby define one or more regions in said first charge-carrier-transporting material layer; and (d) depositing a second charge-carrier-transporting material in at least one of said one or more regions.

2. The method of claim 1, wherein said step (a) comprises creating a set of ordered nanoparticle arrays on at least a portion of said first conductive substrate.

3. The method of claim 2, wherein said step (b) comprises introducing at least a portion of a first charge-carrier-transporting material layer in interstitial spaces between nanoparticles in said set of ordered nanoparticle arrays.

4. The method of claim 3, wherein said first charge-carrier-transporting material is selected from the group consisting of a hole-carrying material and an electron-carrying material.

5. The method of claim 4, wherein said hole-carrying material comprises a conjugated polymer material.

6. The method of claim 5, wherein said conjugated polymer material comprises poly-phenylene vinylene.

7. The method of claim 4, wherein said electron-carrying material comprises titanium dioxide.

8. The method of claim 1, wherein said second charge-carrier-transporting material is selected from the group consisting of a hole-carrying material and an electron-carrying material.

9. The method of claim 8, wherein said hole-carrying material comprises a conjugated polymer material.

10. The method of claim 9, wherein said conjugated polymer material comprises poly-phenylene vinylene.

11. The method of claim 9, wherein said electron-carrying material comprises titanium dioxide.

12. The method of claim 1, further comprising the step of inserting one or more blocking layers between said first charge-carrier-transporting material layer and said second conductive substrate for inhibiting bi-directional charge-carrier flow.

* * * * *